(12) United States Patent
Ribo

(10) Patent No.: US 6,549,597 B2
(45) Date of Patent: Apr. 15, 2003

(54) HIGH SPEED PHASE ALIGNMENT PROCESS AND DEVICE

(75) Inventor: Jerome Ribo, Villeneuve Loubet (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/734,222

(22) Filed: Dec. 11, 2000

(65) Prior Publication Data

US 2002/0009171 A1 Jan. 24, 2002

(51) Int. Cl.$^7$ .................................................. H03D 3/24
(52) U.S. Cl. ........................................ 375/373; 375/376
(58) Field of Search .............................. 375/373, 376, 375/354, 327, 357, 326; 327/141, 144, 147, 148, 231, 233, 236

(56) References Cited

U.S. PATENT DOCUMENTS 5,550,860 A  * 8/1996  Georgiou et al. ............ 370/517
5,579,352 A  * 11/1996  Llewellyn ................... 327/144
5,692,022 A  * 11/1997  Haulin et al. ................ 375/357
6,285,726 B1 * 9/2001  Gaudet ........................ 327/156

OTHER PUBLICATIONS

Texas Instruments Incorporated, *Communication Channel*, current pending patent application No. 09/368,055, filed Aug. 3, 1999.

* cited by examiner

Primary Examiner—Chi Pham
Assistant Examiner—Khai Tran
(74) Attorney, Agent, or Firm—Gerald E. Laws; W. James Brady, III; Frederick J. Telecky, Jr.

(57) ABSTRACT

A device for phase alignment between a data signal and a main clock signal, characterized by the fact that, from a main clock signal, it has some means of generation of clock signals which are phase-shifted with respect to one another by a fraction of a period of said main clock signal, some means 10 of dividing the input data signal by sampling of said signal by said clock signals in order to obtain data signals with a length equal to said fraction of a period of said main clock signal, observation window 14 of said sampled data bits, said window 14 having a length equal to a data bit of the entering signal, a set of pipelines 16 for parallel processing using an algorithm of the signals transmitted by the observation window in view of retrieving data signals, and device 18, 19 for drift compensation.

8 Claims, 6 Drawing Sheets

HIGH SPEED PHASE ALIGNMENT PROCESS AND DEVICE

This application is related to French Patent Application Number 9814991, filed Nov. 27, 1998.

TECHNICAL FIELD OF THE INVENTION

The present invention relates to phase alignment devices and relates more particularly to high speed phase alignment devices intended for alignment of data and clock signals.

BACKGROUND OF THE INVENTION

In a typical phase alignment device for recovering a serial data stream, a clock generator forms a multiphase clock signal. The alignment device determines which clock phase is nearest to the center of data bits within the stream of data, and then selects this clock phase for sampling the data stream.

SUMMARY OF THE INVENTION

The solution according to the invention differs from known solutions in that the algorithm used does not attempt to find the best phase for sampling the data, but rather tries to find the best position for a window of n bits in order to observe the flow of data, which is digitized with a precision of 1/n of the clock period.

Inside of this observation window, the algorithm tries to find a transition front. When a transition front is found, the next bit is the data. This makes it possible to have a data length of T/n, T being the clock period.

The invention relates to a process for alignment of phase between a data signal and a main clock signal, characterized by the fact that the flow of data of the input signal is divided into elements with a length equal to a fraction of the clock period by sampling of said input signal using signals taken from said clock signal which are phase-shifted with respect to one another by said fraction of a period of the main clock signal, the bits of data thus obtained are observed through a window with a length of a bit of the data signal, the window is moved so that the transition edges of the data bits are in its center, and the flow of data thus observed is transmitted to pipelines in which they under parallel processing, ensuring the extraction of the data bits which they contains.

According to a particular characteristic, the presence of a data bit in said sampled signal is determined either by the presence of a transition front or, in the absence of a transition front, by the last bit of the word.

Another aspect of the invention pertains to re-timing data to the most appropriate clock and to delivering the data with a reference clock in spite instabilities and distortion in the input data and in the clock signals.

The invention also relates to a phase alignment device for implementation of the process defined above, characterized by the fact that it includes some means of generation, from a main clock signal, of clock signals which are phase-shifted with respect to one another by a fraction of a period of said main clock signal, a drift compensation unit which uses as input the data coming from the pipelines and provides data in parallel form as output, said drift compensation being ensured by the intermediary of an output window, a first shift register for checking the position of the observation window, a second shift register for checking the position of the output window, a third shift register for checking the loading and unloading of the pipelines, and a control unit which manages the movement of the observation and output windows as a function of the information collected on the position of the transitions in the pipelines and as a function of the position of the observation window.

An advantage of the present solution is that a smaller length for the input data can be tolerated. Likewise, better immunity with regard to instabilities is ensured. Therefore, a higher operating frequency is allowed.

These and other features of the invention that will be apparent to those skilled in the art from the following detailed description of the invention, taken together with the accompanying drawings.

DESCRIPTION OF THE DRAWINGS

The invention will be better understood with the help of the following description given only as an example in reference to the appended drawings in which.

Corresponding numerals and symbols in the different figures and tables refer to corresponding parts unless otherwise indicated.

DETAILED DESCRIPTION OF THE INVENTION

Figure 1:
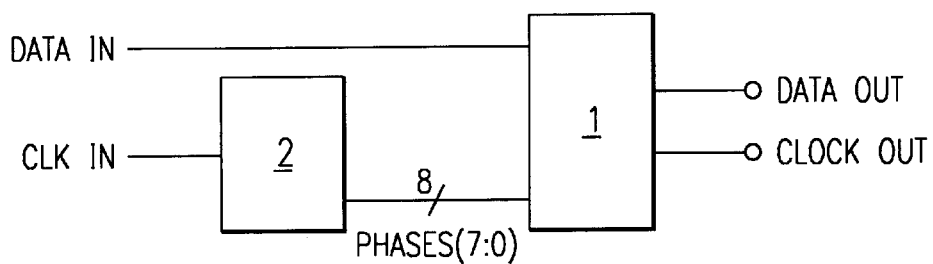
FIG. 1 is a black diagram of a conventional type of phase alignment device.

In FIG. 1, a conventional type of phase alignment device has been represented. Phase alignment device 1 has a first input connected to clock signal generator 2. Clock signal generator 2 receives input clock signal CLKIN and delivers to alignment device 1, clock signals with eight different phases PHASE-0 to PHASE-7 through eight outputs. The alignment device delivers output data DATA OUT and an output clock signal CLKOUT.

Figure 2:
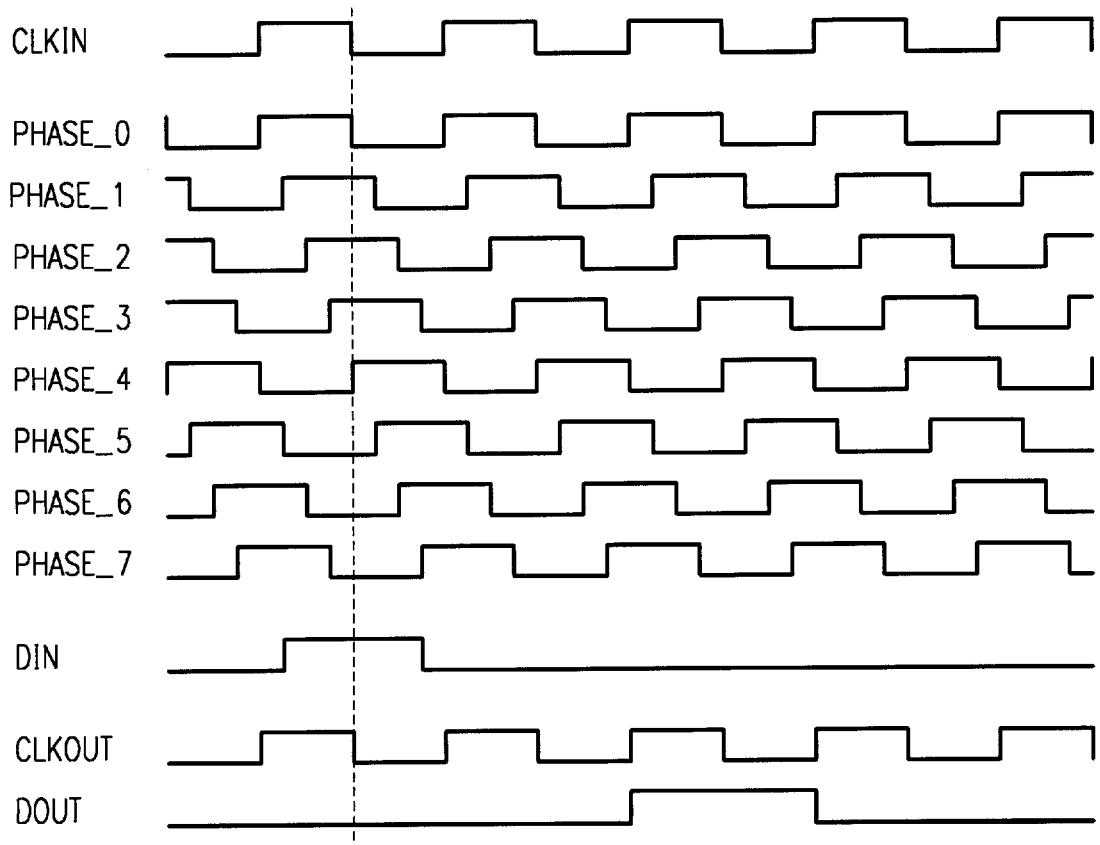
FIG. 2 is a diagram showing the phase alignment obtained, using the device of FIG. 1, between an input signal and a clock signal.

The input and output signals of the phase alignment device are represented in FIG. 2. The eight phases delivered by generator 2 are phase-shifted by ⅛ of a clock period with respect to one another. One of these phases is chosen by the alignment device for sampling the data.

In the example represented in FIG. 2, input signal DIN is sampled by phase 4 because this is the phase for which the rising edges are in the center of a data bit. As output, the signals are retimed based on a reference phase, in this case phase ϕ.

According to the invention, one does not seek to find the best phase for sampling entering data. One uses the phases for digitizing the flow of data with a precision of 1/N of the clock period.

Figure 3:
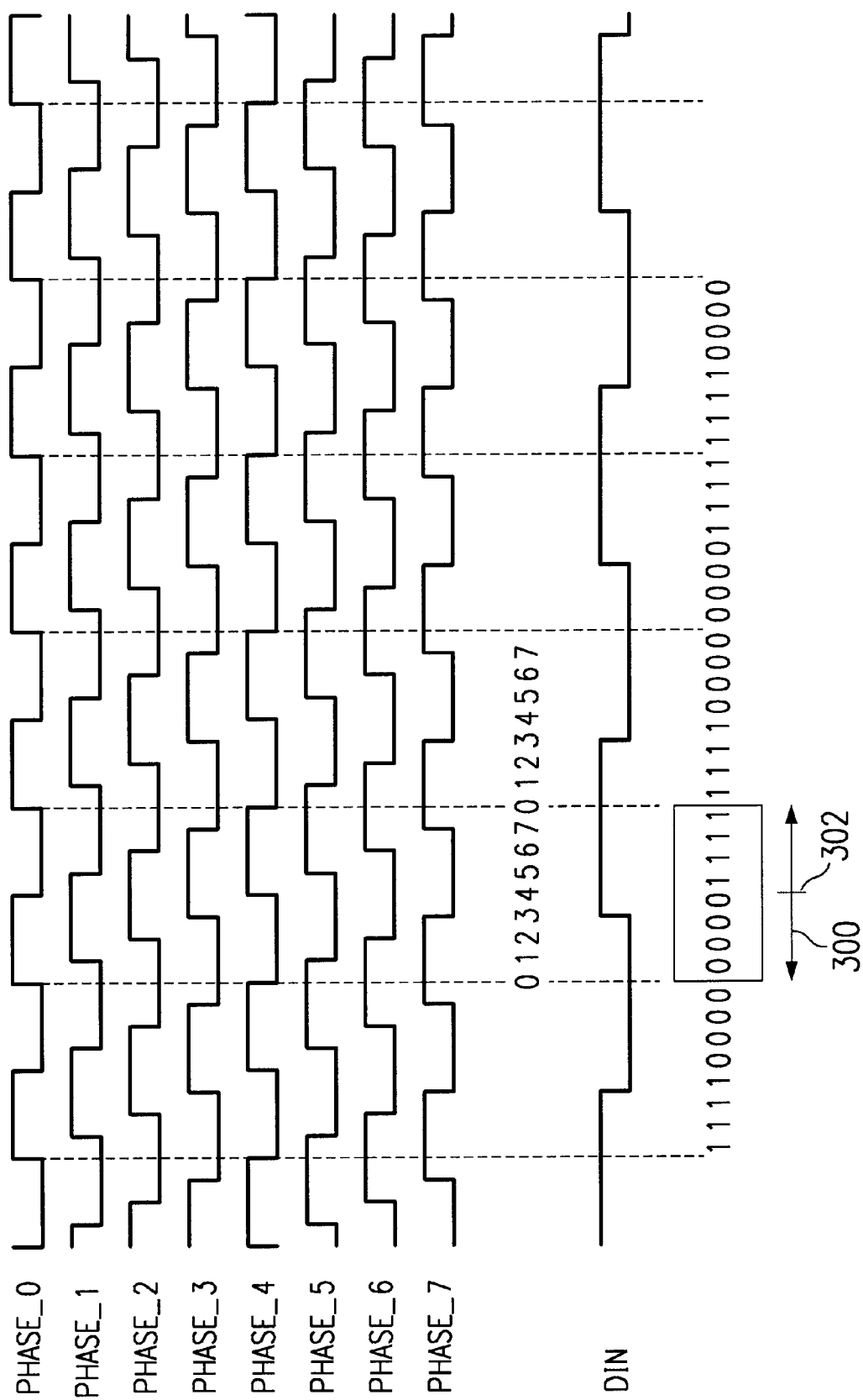
FIG. 3 is a timing diagram representing the principle of digitization and observation of the flow of data, through a window, according to the invention.

FIG. 3 is a timing diagram representing the principle of digitization and observation of the flow of data, through a window, according to the invention. Input signal DIN is sampled using eight clock signals PHASE_0-PHASE_7 which are phase-shifted with respect to one another by ⅛ of a clock period of the main clock signal. As a function of the state of said signal, one obtains eight binary conditions each corresponding to a transition front of one of the eight clock signals.

The flow of data thus obtained is observed through a window with a length of a data bit. The optimal position for the observation window is found when the data transitions are in its center, as indicated in window 300 at position 302.

To be able to operate at a high frequency, the elements of data of one bit length coming from the observation window are transmitted to several pipelines for parallel processing. Inside of each pipeline, an algorithm tries to find a transition front. When an edge is found, the next bit is the data. If there is no transition front, the last bit of the word is the data.

The fact of not looking for the best phase for sampling the data, but rather looking for the best position for an observation window in which the algorithm described above is applied, makes it possible to accept much higher distortions in the data than would be acceptable in a conventional solutions.

In terms of "jitter", for example, as long as the transition front remains in the observation window, no error is committed. Therefore it is possible, ideally, to accept jitter equivalent to ±one half period of the clock. Likewise, a data bit will be able to have a length at least equivalent to the distance separating two phases used for digitization (T/n) without consequently affecting the jitter tolerance.

Besides the digitization of the data, the other important advantage of this solution is the fact that only a single clock is used, that is to say that no data re-timing is necessary.

With this technique, the possibility, of recovering a stream of distorted data makes possible a significant energy savings in the high speed I/O [input/output] design.

In summary, this solution is stronger because of the distortion which it can tolerate, and it makes easier clock distribution possible. These two facts allow one to obtain a higher operating frequency.

Figure 4:
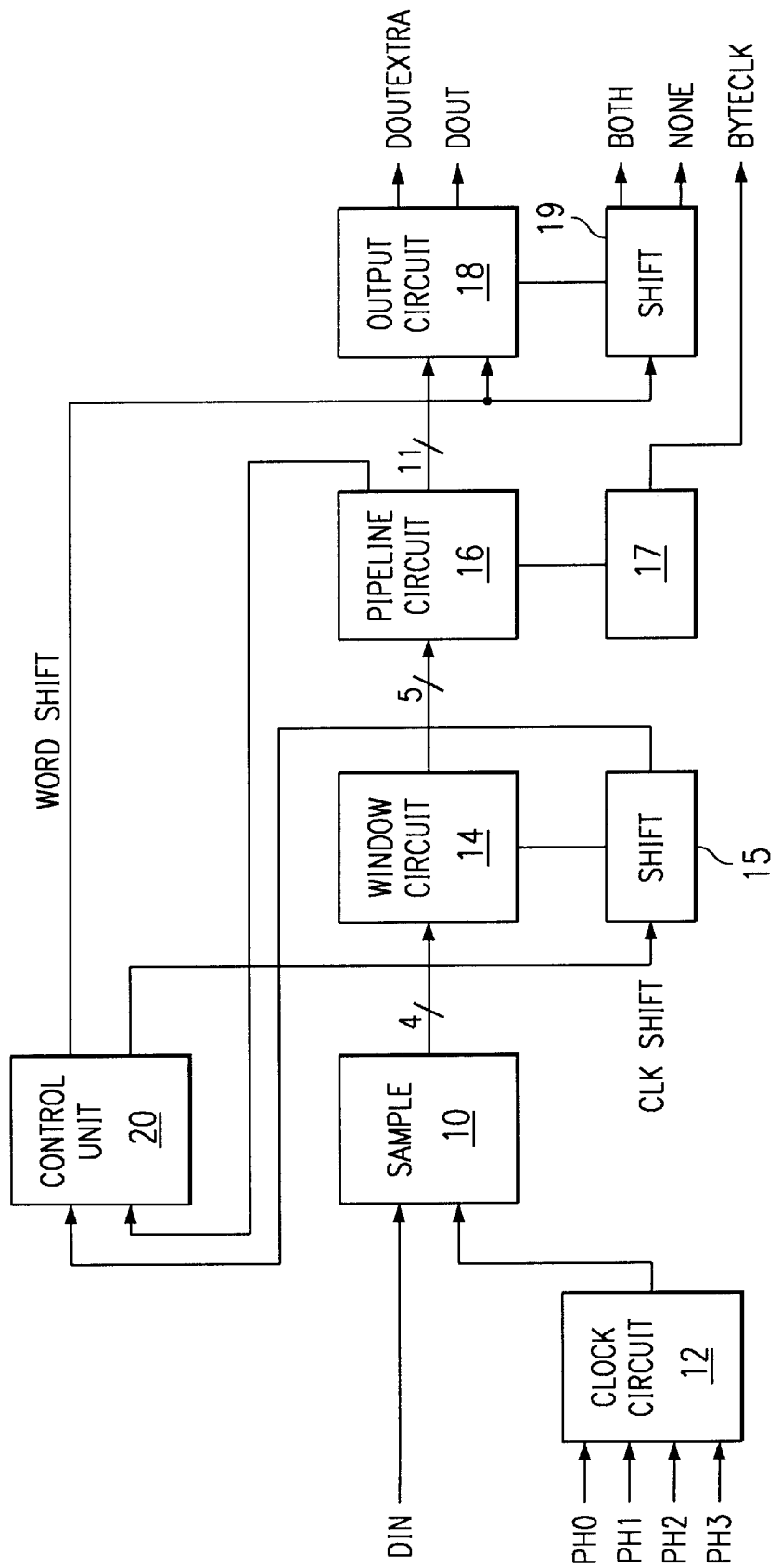
FIG. 4 is a block diagram of the phase alignment device according to the invention.

FIG. 4 represents in detail the high speed phase alignment device according to the invention. The alignment device has sampling circuit 10, which has a first input for input data DIN and second inputs by which it is connected to clock circuit 12, to which clock signals with phase PH0, PH1, PH2, PH3 are applied.

The output of sampling circuit 10, which in fact has four outputs in parallel, is connected to observation window circuit 14 with which observation window shift circuit 15 is associated.

Observation window circuit 14 has five outputs by which it is connected to pipeline circuit 16 with which pipeline loading circuit 17 is associated.

The pipeline circuit has eleven parallel outputs by which it is connected to corresponding inputs of output window circuit 18 with which output window shift circuit 19 is associated.

The output window circuit has a first output for transmission of an output word DOUT and a second output for transmission of an extra output word DOUTEXTRA.

Window shift circuit 19 has two extra outputs "BOTH" and "NONE". When the BOTH output transitions to the high condition, the data present on the DOUTEXTRA output must be inserted into the output data flow.

When the NONE output transitions to the high condition, the data present on the DOUT output must be eliminated from the output data flow.

Observation window shift circuit 15 and output window shift circuit 19 are connected to control unit 20 which also receives instructions from observation window shift circuit 15 and pipeline circuit 16.

Circuit 17 for loading of the pipelines, moreover, provides as output the low frequency clock required by the parallel outputs.

Figure 5A:
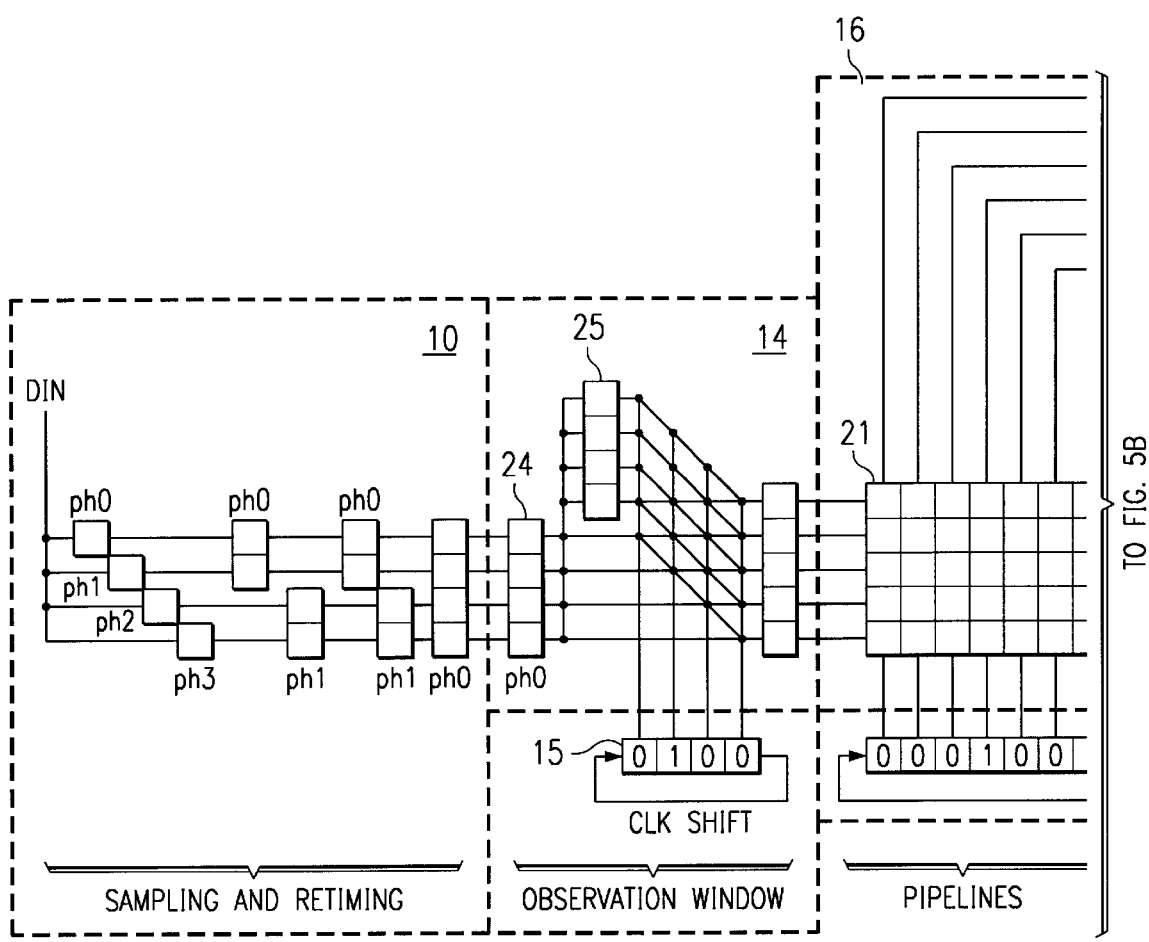
FIG. 5 is a diagram showing certain details of the diagram of FIG. 4.
Figure 5B:
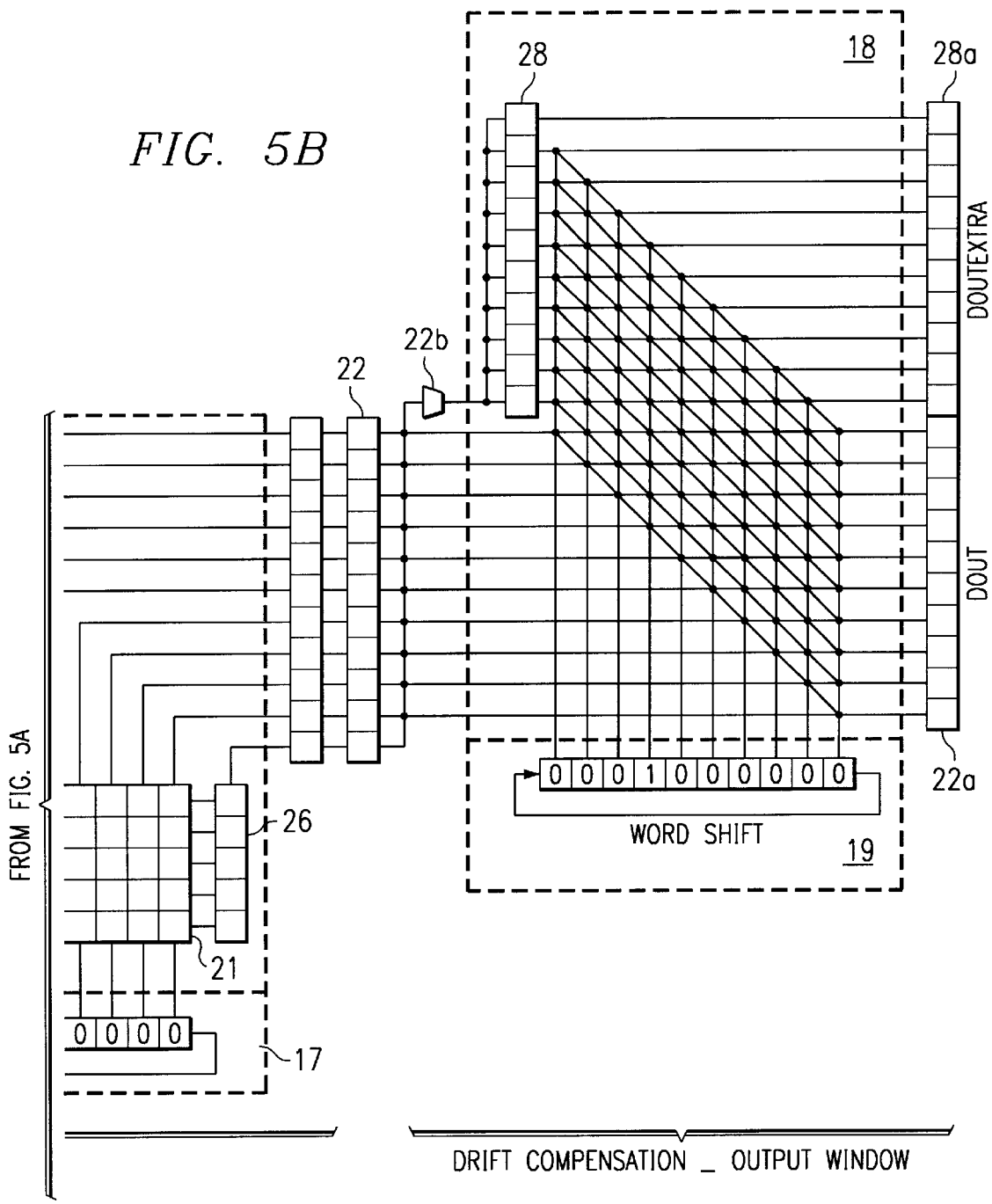

In FIG. 5, the material execution of certain components of the diagram of FIG. 4 have been represented in more detail, these components surrounded by frames in the form of chain-dotted lines being designated by the same reference numbers as the corresponding components of the diagram of FIG. 4.

The functioning of the phase alignment device according to the invention will be described in reference to FIGS. 4 and 5. The flow of data is observed through a window with a length equal to a bit of data of input signal DIN, and an algorithm finds the best position for this observation window.

In order to be able to operate at high frequency, the elements with the length of a bit of sampled data are sent to ten pipelines 21 for parallel processing.

The data is recovered in each pipeline 21 and an upward control UP or downward control DOWN for movement of the observation window is sent to control unit 20 (FIG. 4).

The choice of control UP or DOWN depends on the position in which the data is found.

The ten bits of data coming from the ten pipelines 21 are transmitted to a twenty-bit register used for delivering ten bits of data in parallel (output DOUT) with a ±5 bits drift compensation capacity.

When the capacity of this register is exceeded, two flags called BOTH and NONE coming from the output window shift circuit plus an extra ten-bit word DOUTEXTRA transmitted by output window 18 are used to allow an exterior system to recover the data.

The entering data DIN are sampled inside of sampling unit 10 using each of the four phases PH0 to PH3. The objective is to digitize the data with a precision of ¼ of the clock period.

Three different phases are used for correctly retiming these samples and for guaranteeing a wait of at least ¾ of a clock period before timing a data item.

The data sampled by the signals PH0 and PH1 are timed twice by the signal PH0.

At the same time, the data sampled by PH2 and PH3 are timed by PH2 and a second time by PH1. After these two steps, it is possible to load the four samples on the same clock signal PH0.

This unit is the most important with regard to the maximum operating frequency because, in this case, one is trying to achieve timing below the clock period. This problem is minimized by using two retiming steps such that it is possible to guarantee that one is not working at less than ¾ of the clock period. The four samples coming from the sampling unit are loaded in four-bit register 24.

In the course of the next clock period, a new word of four samples is loaded and the old word is stored in another four-bit register 25. This allows one to have a word containing eight consecutive samples in the entering data flow. It is then easy to choose five out of these eight samples in order to send them to PIPELINE unit 16.

Each position of observation window 14 is implemented by five transmission gates which are open when the corresponding bit of the forward-backward shift register CLK-SHIFT 15 is at 1.

The position of the observation window is determined by control unit 20 (FIG. 4) which "filters" the instructions coming from pipelines 21 (FIG. 5). For example, it is necessary to have 25 UP counting commands in order to move the window one increment (¼ of the clock period).

When the word contained in register 15, for control of observation window 14, transitions from 1000 to 0001, observation window 14 moves from a high position corresponding to the transmission of the bits contained in register 25 to a low position corresponding to the transmission of the bits contained in register 24; the sample word which is copied at the same time in register 25 has to be sent to an extra pipeline 26 so as not to be lost.

This extra word is re-inserted in the data flow by drift compensation unit 18.

In the same way, when the word contained in shift register 15 transitions from 0001 to 1000, observation window 14 transitions from a low position to a high position. The sample word which is copied at the same time in the top register was already sent to pipeline 21 (FIG. 5) so that it must be eliminated from the flow of data in order not to be duplicated.

This is done by drift compensation unit 18. Ten pipelines 21 plus pipeline 26 for the "extra bit" ensure parallel processing. Inside of each pipeline 21, an algorithm tries to find a transition edge. When an edge is found, the next bit is the data. If there is no transition edge, the last bit of the word is the data.

If an edge is found on the first part of the word, an upward control UP is sent to control unit 20. If an edge is found in the second part of the word, a downward control DOWN is sent to control unit 20.

Shift register CLKPIPE 17 with ten bits is timed with each clock period, the "1" circulating in the register controlling the loading of the ten pipelines and, ten clock periods later, the storage of the extracted data.

Every ten clock periods, the ten bits of data coming from pipeline unit 16 are loaded in 10-bit register 22. Ten clock periods later, a new word of ten bits of data is loaded and the old word is stored in another ten-bit register 28. This allows one to have a word with twenty consecutive bits of data. As is done in observation window 14, it is possible to take ten bits of data from these twenty bits in order to put out DOUT data.

The position of output window 18 is determined by control unit 20 (FIG. 4) which moves output window 18 upward each time an "extra bit" is added to the flow of data, and moves output window 18 downward each time a bit must be eliminated from the flow of data.

The addition of the "extra bit" occurs during the copying of the ten-bit word. Multiplexer 22b makes it possible to perform this operation. In the same way, elimination occurs by overlapping the two ten-bit words by a bit.

When the word WORDSHIFT contained in output window shift register 19 transitions from 1000000000 to 0000000001, output window 18 transitions a high position to a low position. The word copied at the same time in high register 28 must be sent to an "extra" output register, DOUTEXTRA 28a, in order not to be lost.

At the same time, the BOTH flag becomes high in order to indicate to an exterior system that this extra word should be inserted in the flow of data.

In the same way, when the word WORDSHIFT transitions from 0000000001 to 1000000000, observation window 14 transitions from a low state to a high position. The word copied at the same time in the top register 28 has already been sent to DOUT output register 22a so that it must be eliminated from the flow of data in order not to be duplicated.

The flag NONE transitions from the high condition in order to indicate not to take this word into account.

Figure 6:
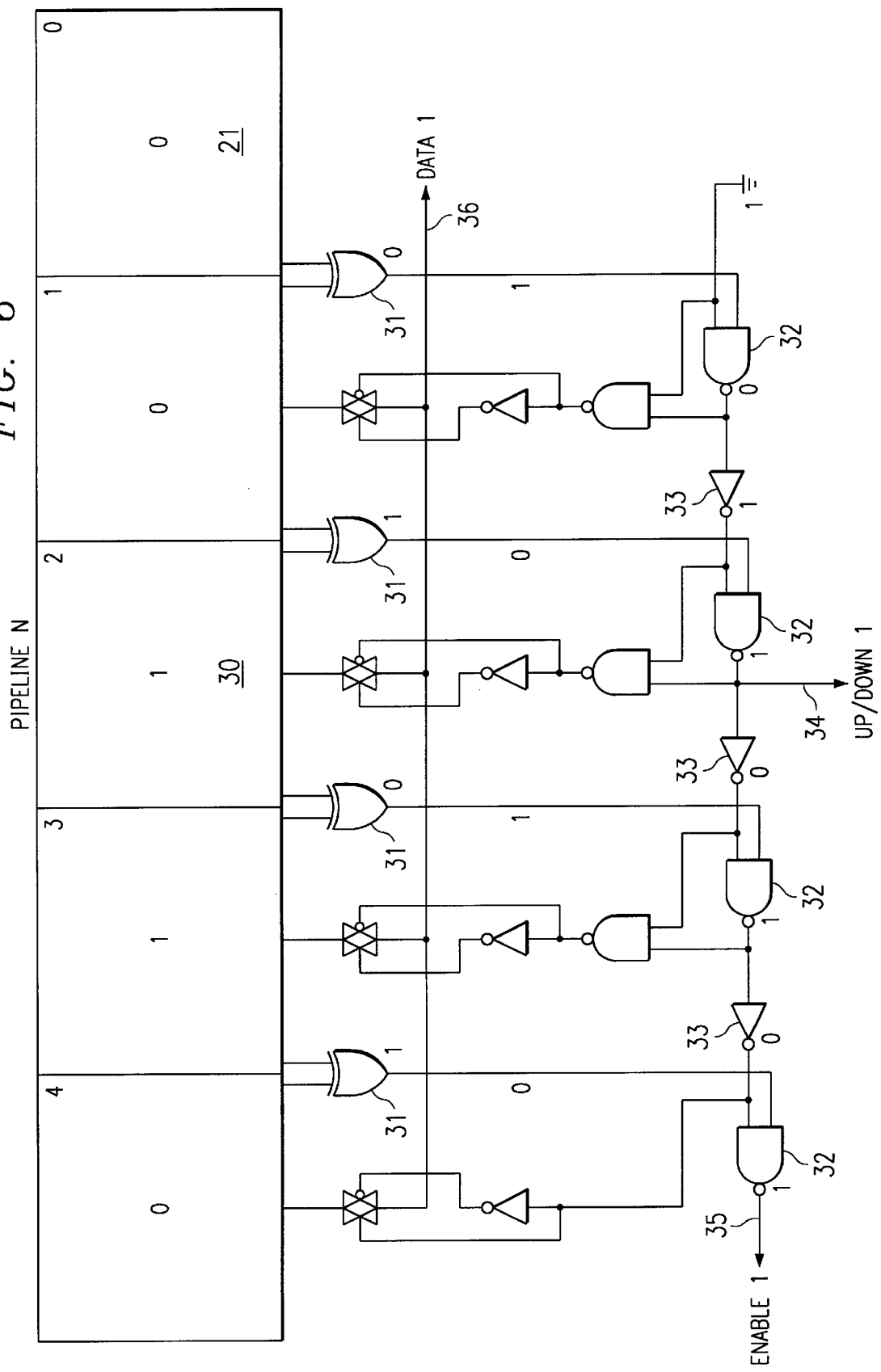
FIG. 6 is a diagram of a pipeline included in the construction of the phase alignment device according to the invention.

One of pipelines 21, which is part of pipeline circuit 16 of FIG. 5, has been represented in FIG. 6. This pipeline has five-bit register 30. EXCLUSIVE OR gates 31, each associated with two neighboring bits of register 30, have an input connected to one bit and another input connected to the neighboring bit. The output of each EXCLUSIVE OR gate 31 is connected to an input of a corresponding NOT-AND gate 32. The other input of the first NOT-AND gate 32 from the right receives a logical "1" whereas the other inputs of the other three NOT-AND gates 32 are connected to the outputs of the neighboring NOT-AND gates by the intermediary of NOT circuits 33. Output 34 of the second NOT-AND gate 32 from the right is the UP/DOWN output for control of observation window 14. The data of the pipeline are available on data output 36.

After loading of the sampling word in five-bit register 30, depending on the condition of their output which depends on the levels of the bits of register 30 which are applied to the corresponding EXCLUSIVE OR gates, NOT-AND gates 32 connected to EXCLUSIVE OR gates 31 make it possible to know whether a transition front has been found and, if so, then where it was found.

The change of condition between two bits of each NOT-AND gate 32 directly opens the correct transmission gate for delivering the data bit which follows the transition.

The arrangement just described makes it possible to execute phase alignments at a frequency of 935 MHz.

The technique just described is based on numerical algorithms which makes it possible to produce solutions using standard CMOS technology.

Other Embodiments

Although the present invention and its advantages have been described in detail, it should be understood that various changes, substitutions and alterations can be made herein without departing from the spirit and scope of the invention as defined by the appended claims.

What is claimed is:

1. A process for alignment of phase between a data signal and a main clock signal, wherein the data signal comprises a sequence of data bits each having a data bit length, comprising the steps of:

digitizing the data signal to form sample elements with a length equal to a fraction of a period of the main clock signal by sampling of said data signal using phase signals derived from said main clock signal which are phase-shifted with respect to one another by said fraction of a period of the main clock signal, observing a set of sequential sample elements of the data signal thus obtained through an observation window, wherein the observation window has a length approximately equal to the data bit length, moving the observation window so that a transition edge between two adjacent data bits is centered in the window, transmitting sets of sequential sample elements thus observed to a plurality of pipelines such that each of the plurality of pipelines receives a different set of sequential sample elements, and processing each set of sequential sample elements in each of the plurality of pipelines in a parallel manner to recover a data bit contained therein.

2. A phase alignment process according to claim 1, wherein the step of processing comprises the steps of:

determining if a transition edge is present in a given set of sequential sample elements, and recovering a data bit from the given set of sequential sample elements by either selecting a sample element that follows the transition edge or, in the absence of a transition edge, by selecting a last sample element of the given set of sequential sample elements.

3. The process according to claim 2, wherein the step of processing further comprises the steps of:

determining if the transition edge is located in the approximate center of the given set of sequential sample elements;

providing position indicia from the plurality of pipelines indicative of positioning of transition edges in the sets of sequential sample elements; and wherein the step of moving the observation window is responsive to the position indicia.

4. The process according to claim 3, wherein the step of providing position indicia provides position indicia responsive to each of the plurality of pipelines.

5. The process according to claim 3, further comprising the step of filtering the position indicia and wherein the step of moving is responsive to the filtered position indicia.

6. The process according to claim 1, further comprising the steps of:

arranging each recovered data bit from each of the plurality of pipelines to form a string of consecutive recovered data bits;

selecting a set of output data bits from the string of consecutive recovered data bits through an output window;

moving the output window as needed one direction in order to add an extra output data bit; and moving the output window as needed in an opposite direction in order to eliminate a duplicate output data bit.

7. The process according to claim 6, wherein the steps of moving the output window are responsive to the step of moving the observation window.

8. A phase alignment device for alignment of phase between a data signal and a main clock signal, comprising:

means of generation, from a main clock signal, of clock signals which are phase-shifted with respect to one another by a fraction of a period of said main clock signal, drift compensation unit 18, 19 which uses as input the data coming from a pipelines 16 and provides data in parallel form as output, said drift compensation being ensured by the intermediary of an output window, a first shift register for checking the position of observation window 14, a second shift register for checking the position of output window 18, a third shift register for checking the loading and unloading of pipelines 16, and a control unit 20 which manages the movement of observation and output windows 14, 18 as a function of the information collected on the position of the transitions in pipelines 16 and as a function of the position of observation window 14.

\* \* \* \* \*